US011817468B2

(12) United States Patent
Lee et al.

(10) Patent No.: US 11,817,468 B2
(45) Date of Patent: Nov. 14, 2023

(54) IMAGE SENSING DEVICE

(71) Applicant: SK hynix Inc., Icheon-si (KR)

(72) Inventors: Kyoung In Lee, Icheon-si (KR); Hoon Sang Oh, Icheon-si (KR); Sung Joo Hong, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 176 days.

(21) Appl. No.: 17/358,733

(22) Filed: Jun. 25, 2021

(65) Prior Publication Data

US 2022/0020795 A1 Jan. 20, 2022

(30) Foreign Application Priority Data

Jul. 14, 2020 (KR) ........................ 10-2020-0086983

(51) Int. Cl.
*H01L 27/146* (2006.01)
*H04N 25/13* (2023.01)

(52) U.S. Cl.
CPC .. *H01L 27/14621* (2013.01); *H01L 27/14645* (2013.01); *H04N 25/134* (2023.01)

(58) Field of Classification Search
CPC .................. H04N 25/134; H04N 25/44; H01L 27/14621; H01L 27/14645; H01L 27/14603; H01L 27/14627; H01L 27/14605; H01L 27/1463; H01L 27/1462
See application file for complete search history.

(56) References Cited

U.S. PATENT DOCUMENTS

2009/0066821 A1* 3/2009 Achong ............... H04N 23/843 348/E5.091
2011/0234864 A1* 9/2011 Inokuma ............. H04N 25/134 348/E9.002
2011/0317048 A1* 12/2011 Bai ......................... H04N 5/33 257/443
2012/0205765 A1* 8/2012 Hynecek ........... H01L 27/14632 257/E31.127
2014/0339606 A1* 11/2014 Lin .................. H01L 27/14621 438/70
2017/0339387 A1* 11/2017 Seger ...................... H04N 9/77
2018/0255215 A1* 9/2018 Lee ........................ H04N 23/55
2019/0035838 A1* 1/2019 Byun ..................... H01L 23/50

FOREIGN PATENT DOCUMENTS

JP 2013125933 A 6/2013
KR 20190099051 A 8/2019

* cited by examiner

*Primary Examiner* — Lin Ye
*Assistant Examiner* — John H Morehead, III
(74) *Attorney, Agent, or Firm* — Perkins Coie LLP

(57) ABSTRACT

An image sensing device includes a pixel array including a (2×2) array that includes two first pixels, a second pixel, and a third pixel, wherein the first to third pixels have a pixel area and include first to third optical filters that are configured to transmit light of different colors, respectively, and wherein the second pixel or the third pixel includes a grid structure located along a boundary of the second pixel or the third pixel, and wherein the first pixel includes a red optical filter and has a first light reception area that is greater than a second light reception area of the second pixel or a third light reception area of the third pixel.

20 Claims, 11 Drawing Sheets

IMAGE SENSING DEVICE

CROSS-REFERENCE TO RELATED APPLICATION

This patent document claims the priority and benefits of Korean patent application No. 10-2020-0086983, filed on Jul. 14, 2020, the disclosure of which is incorporated by reference in its entirety as part of the disclosure of this patent document.

TECHNICAL FIELD

The technology and implementations disclosed in this patent document generally relate to an image sensing device.

BACKGROUND

An image sensing device is used in electronic devices to convert optical images into electrical signals. The recent development of automotive, medical, computer and communication industries is leading to an increase in demand for higher-performance image sensing devices in various devices such as smartphones, digital cameras, camcorders, personal communication systems (PCSs), game consoles, surveillance cameras, medical micro-cameras, robots, infrared (IR) sensing devices, etc.

Image sensing devices may be broadly classified into CCD (Charge Coupled Device) image sensing deviced and CMOS (Complementary Metal Oxide Semiconductor) image sensing devices.

The CCD image sensing devices may have a simpler and more convenient driving scheme than those in than the CCD sensing devices, and thus may be preferred in some applications. The CMOS image sensing devices may integrate a signal processing circuit into a single chip, making it easy to miniaturize the sensors for implementation in a product, with the added benefit of consuming lower power consumption. In addition, the CMOS image sensing devices can be fabricated using a CMOS fabrication technology, which results in low manufacturing cost. CMOS image sensing devices have been widely used due to their suitability for implementation in mobile devices.

SUMMARY

Various embodiments of the disclosed technology relate to an image sensing device including a pixel with improved performance.

Various embodiments of the disclosed technology relate to an image sensing device capable of adjusting sensitivity of a certain light (desired light) in a pixel with the use of a grid structure.

In one aspect, an image sensing device is provided to include a pixel array in which first to third pixels, which respectively include optical filters corresponding to different colors and are formed to have a same pixel area, are arranged in a matrix array, wherein the second pixel adjacent to the first pixel or the third pixel adjacent to the first pixel includes a grid structure; the pixel array includes a central array arranged in a (2×2) array that includes two first pixels, the second pixel, and the third pixel; and the first to third pixels have first to third light reception areas, respectively. The first light reception area of the first pixel contained in the central array is larger in size than either the second light reception area of the second pixel contained in the central array or the third light reception area of the third pixel contained in the central array, and the first pixel includes a red optical filter.

In another aspect, an image sensing device is provided to include a pixel array including a (2×2) array that includes two first pixels, a second pixel, and a third pixel, wherein the first to third pixels have a pixel area and include first to third optical filters that are configured to transmit light of different colors, respectively, and wherein the second pixel or the third pixel includes a grid structure located along a boundary of the second pixel or the third pixel, and wherein the first pixel includes a red optical filter and has a first light reception area that is greater than a second light reception area of the second pixel or a third light reception area of the third pixel.

In some implementations, the two first pixels are arranged to face each other in a diagonal direction.

In some implementations, the first pixel array further includes additional first to third pixels surrounding the (2×2) array to form a (4×4) array including the (2×2) array at a center of the (4×4) array, and wherein the (4×4) array includes two first (2×2) arrays that include the first pixels and the additional first pixels, a second (2×2) array including the second pixel and the additional second pixels, and a third (2×2) array including the third pixel and the additional third pixels.

In some implementations, in the pixel array, the (4×4) array is repeatedly arranged either in a first direction or in a second direction perpendicular to the first direction.

In some implementations, the grid structure is disposed along an outer boundary of the second (2×2) array that is located on a same row with one of the first (2×2) arrays, and the grid structure is disposed along an outer boundary of the third (2×2) array that is located on a same row with the other of the first (2×2) arrays.

In some implementations, the grid structure may further include a first internal grid structure disposed along a boundary between the second pixel and the additional second pixels and along a boundary between the third pixel and the additional third pixels.

In some implementations, wherein the first pixel array further includes additional first to third pixels surrounding the (2×2) array to form (6×6) array including the (2×2) array at a center of the (6×6) array, and wherein the (6×6) array includes two first (3×3) arrays that include the first pixel and the additional first pixels, a second (3×3) array including the second pixel and the additional second pixels, and a third (3×3) array including the third pixel and the additional third pixels.

In some implementations, in the pixel array, the (6×6) array is repeatedly arranged either in a first direction or in a second direction perpendicular to the first direction.

In some implementations, the grid structure is disposed along an outer boundary of the second (3×3) array that is located on a same row with one of the first (3×3) arrays, and the grid structure is disposed along an outer boundary of the third (3×3) array that is located on a same row with the other of the first (3×3) arrays.

In some implementations, the grid structure may further include a second internal grid structure disposed along a boundary between the second pixel and the additional second pixels and along a boundary between the third pixel and the additional third pixels.

In some implementations, a second light reception area of one of the additional second pixels that is disposed at a center portion of the second (3×3) array is identical in size to the pixel area, and a third light reception area of one of the additional third pixels that is disposed at a center portion of the third (3×3) array is identical in size to the pixel area.

In some implementations, the second pixel includes a green optical filter and the third pixel includes a blue optical filter.

In some implementations, the first light reception area is identical in size to the pixel area.

In some implementations, the second light reception area is identical in size to the third light reception area.

In some implementations, in the pixel array, the (2×2) array is repeatedly arranged either in a first direction or in a second direction perpendicular to the first direction.

In some implementations, the grid structure includes at least one of a metal material and a low refractivity material that has a lower refractive index than the optical filter.

In another aspect, an image sensing device is provided to include a pixel array including first to third pixels that respectively include first to third optical filters corresponding to different wavelengths of light, wherein the first pixel has a light reception region that is larger in size than a light reception region of the second pixel adjacent to the first pixel or a light reception region of the third pixel adjacent to the first pixel, the second pixel or the third pixel includes a grid structure disposed at one side of the second pixel or the third pixel and the first optical filter is a red optical filter.

In some implementations, the pixel array may include two or more first (2×2) arrays including the first pixels, one or more second (2×2) arrays including the second pixels, and one or more third (2×2) arrays including the third pixels, wherein a number of the first (2×2) arrays contained in the pixel array is twice a number of the second (2×2) arrays or a number of the third (2×2) arrays.

In some implementations, the pixel array may include two or more first (3×3) arrays including the first pixels, one or more second (3×3) arrays including the second pixels, and one or more third (3×3) arrays including the third pixels, wherein a number of the first (3×3) arrays contained in the pixel array is twice a number of the second (3×3) arrays or the number of the third (3×3) arrays.

It is to be understood that both the foregoing general description and the following detailed description of the disclosed technology are illustrative and explanatory and are intended to provide further explanation of the disclosure as claimed.

BRIEF DESCRIPTION OF THE DRAWINGS

The above and other features and beneficial aspects of the disclosed technology will become readily apparent with reference to the following detailed description when considered in conjunction with the accompanying drawings.

DETAILED DESCRIPTION

Figure 1:
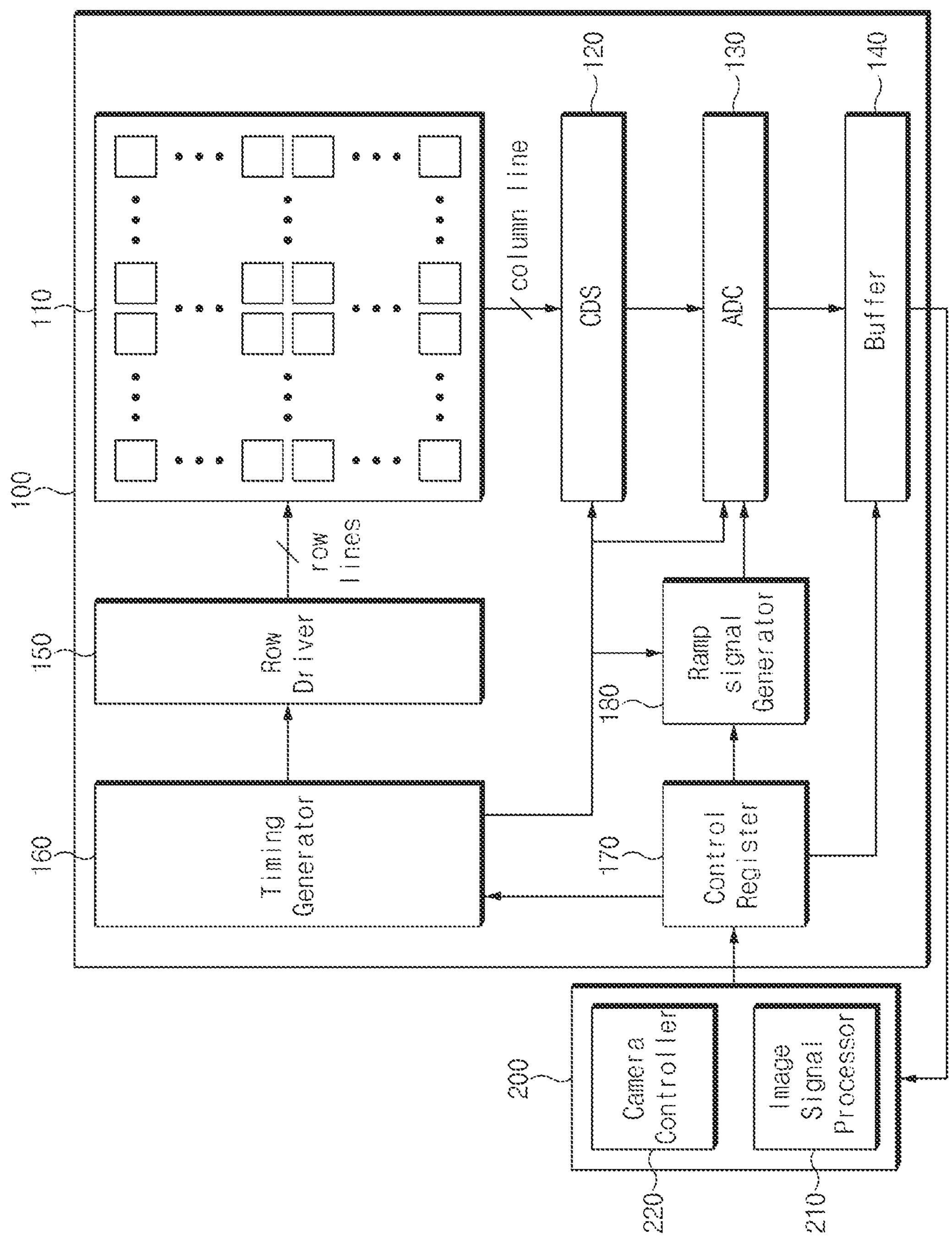
FIG. 1 is a block diagram illustrating an example of an image sensing device based on some implementations of the disclosed technology.

This patent document provides implementations and examples of an image sensing device capable of efficiently sensing a red light signal in a pixel, which can substantially address one or more issues due to limitations and disadvantages of the related art. Some implementations of the disclosed technology relate to the image sensing device having improved performance in a pixel, which can adjust sensitivity of target light (desired light) in a pixel according to shapes of grid structures. The disclosed technology provides various implementations of an image sensing device which can prevent optical crosstalk between pixels while guaranteeing the area of a red-light reception circuit. In addition, although the pixel becomes smaller in size due to the guaranteed area of the red-light reception circuit, the image sensing device can prevent sensitivity deterioration of a long-wavelength (red light) signal.

Reference will now be made in detail to the embodiments of the disclosed technology, examples of which are illustrated in the accompanying drawings. While the disclosure is susceptible to various modifications and alternative forms, specific embodiments thereof are shown by way of example in the drawings.

Wherever possible, the same reference numbers will be used throughout the drawings to refer to the same or similar parts. In the following description, a detailed description of related known configurations or functions incorporated herein will be omitted to avoid obscuring the subject matter.

FIG. 1 is a block diagram illustrating an example of an image sensing device 100 based on some implementations of the disclosed technology.

Referring to FIG. 1, the image sensing device 100 may include a pixel array 110 including a plurality of pixels arranged in a matrix array, a correlated double sampler (CDS) 120, an analog-to-digital converter (ADC) 130, a buffer 140, a row driver 150, a timing generator 160, a control register 170, and a ramp signal generator 180. In this case, each pixel of the pixel array 110 may include an optical filter.

The image sensing device 100 may sense light beams of different wavelengths reflected from an object captured (or focused) by a lens (not shown) upon receiving a control signal from an image processor 200. The image processor 200 may transmit an output image sensed by the image sensing device 100 to an electronic device provided with a display, and the like.

The image processor 200 may include a camera controller 220, an image signal processor 210, and a PC interface (I/F) (not shown). The camera controller 220 may control the control register 170. In this case, although the camera controller 220 can control operations of the control register 170 of the image sensing device 100 using an inter-integrated circuit (I2C), the scope of the disclosed technology is not limited thereto.

The image signal processor 210 may receive image information corresponding to an output signal of the buffer 140, and may fabricate and process the received image information in a manner that a person can visually identify and recognize the received image with naked eyes, such that the image signal processor 210 may output the resultant processed image to the display.

The pixel array 110 may include a plurality of pixels, each of which has an optical filter. The optical filters contained in the pixel array 110 may be arranged to overlap with photoelectric conversion elements contained in the pixels. Each of the pixels may convert optical image information into an electrical image signal, and may transmit the electrical image signal to the correlated double sampler (CDS) 120. Incident light having penetrated the optical filters contained in the pixel array 110 may be converted into electrical signals by photoelectric conversion elements respectively contained in the unit pixels.

The correlated double sampler (CDS) 120 may hold and sample electrical image signals received from the respective unit pixels (PXs) of the pixel array 110. For example, the correlated double sampler (CDS) 120 may perform sampling of a reference voltage level and a voltage level of the received electrical image signal in response to a clock signal received from the timing generator 160, and may transmit an analog signal corresponding to a difference between the reference voltage level and the voltage level of the received electrical image signal to the analog-to-digital converter (ADC) 130.

The analog-to-digital converter (ADC) 130 may convert received analog signals into digital signals, and may transmit the digital signal to the buffer 140.

The buffer 140 may store or latch each of the digital signals received from the analog-to-digital converter (ADC) 300, and may sequentially output the digital signals to an image signal processor. The buffer 140 may include a memory for storing or latching the digital signals and a sense amplifier for amplifying the digital signals.

The row driver 150 may drive the plurality of pixels of the pixel array 110 in response to an output signal of the timing generator 160. For example, the row driver 150 may generate selection signals capable of selecting any one of the plurality of row lines and/or drive signals for driving any one of the plurality of row lines.

The timing generator 160 may generate a timing signal to control the correlated double sampler (CDS) 120, the analog-to-digital converter (ADC) 130, the row driver 150, and the ramp signal generator 180.

The control register 170 may generate control signals to control the buffer 140, the timing generator 160, and the ramp signal generator 180. As a result, operations of the buffer 140, the timing generator 160, and the ramp signal generator 180 can be controlled by the generated control signals. In this case, the control register 170 may operate under control of a camera controller.

The ramp signal generator 180 may generate a ramp signal for controlling an image signal generated from the buffer 140 in response to a control signal of the timing generator 160.

Figure 2:
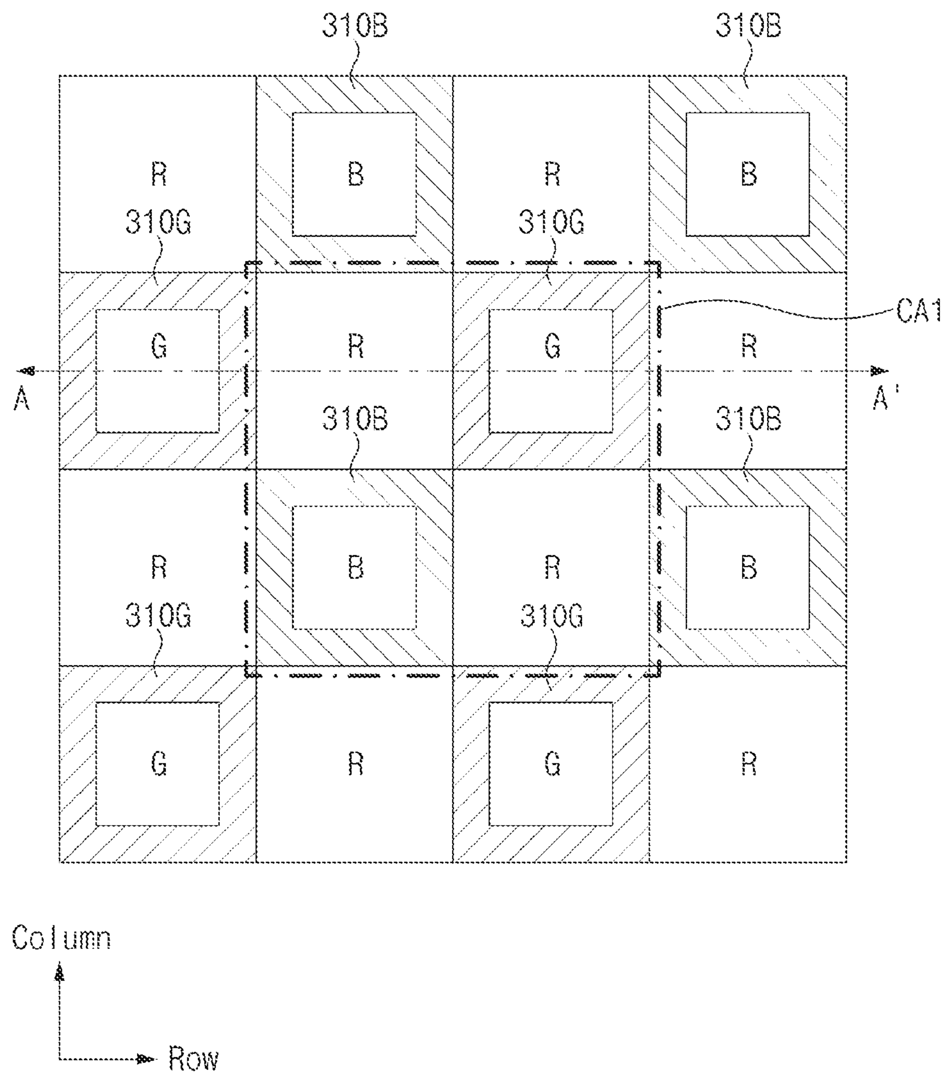
FIG. 2 is a schematic diagram illustrating an example of a pixel array based on a first embodiment of the disclosed technology.

FIG. 2 is a schematic diagram illustrating an example of a pixel array 300 based on a first embodiment of the disclosed technology.

The pixel array 300 may include first to third optical filters R, G, and B and grid structures 310B and 310G. Other structures associated with the pixels, such as transistors, floating diffusion (FD) regions, lines (or wires), etc. are not illustrated in the depiction of the pixel array 300 in FIG. 2 and description for those structures is omitted here to simplify the description.

Referring to FIG. 2, the pixel array 300 according to the first embodiment may include first to third pixels arranged in a matrix array.

The first to third optical filters R, G, and B may be optical filters corresponding to different colors, respectively. For example, the first optical filter (R) may be a red optical filter that selectively transmits light in a certain red color while blocking light in other colors, the second optical filter (G) may be a green optical filter that selectively transmits light in a certain green color while blocking light in other colors, and the third optical filter (B) may be a blue optical filter that selectively transmits light in a certain blue color while blocking light in other colors.

In association with the first to third optical filters R, G, and B, a pixel including the first optical filter (R) will hereinafter be referred to as a first pixel, a pixel including the second optical filter (G) will hereinafter be referred to as a second pixel, and a pixel including the third optical filter (B) will hereinafter be referred to as a third pixel.

Each of the first to third optical filters R, G, and B may selectively pass or transmit light that is incident upon the pixel array 300 and has a certain wavelength while blocking light having other wavelengths. For example, the first optical filter (R) may selectively pass or transmit incident light having a wavelength (e.g., 600 nm to 750 nm) corresponding to red light.

In the example in FIG. 2, the grid structures 310G are structured to surround pixels with optical filters G and the grid structures 310B are structured to surround pixels with optical filters B. each grid structure 310G or 310B is designed to provide optical isolation with an adjacent pixel to reduce optical cross talks between adjacent pixels. For example, each grid structure may be optically absorptive or reflective to provide desired optical isolation between adjacent pixels.

The first to third pixels may have a same pixel areas in the pixel array 300. Thus, the first to third pixels may be identical in size to each other in the pixel array 300. When viewed from the pixel array 300 in a direction (i.e., in a direction along which light is incident) perpendicular to one surface of the substrate of the image sensing device 100, the term "pixel area" may refer to an area occupied by each of the first to third pixels in the pixel array 300.

The first pixel may have a first light reception area, the second pixel may have a second light reception area, and the third pixel may have a third light reception area. Light reception areas of the first to third pixels may be changed depending on shapes of grid structures 310G and 310B.

The term "light reception area" may refer to an area obtained by subtracting the area of the grid structure 310G or 310B from the pixel area of each pixel. Therefore, when the first to third light reception areas are maximized in size, the first light reception area may be identical in size to the pixel area of the first pixel, the second light reception area may be identical in size to the pixel area of the second pixel, and the third light reception area may be identical in size to the pixel area of the third pixel.

The term “light reception region” may refer to a region through which incident light can pass in the pixel. In more detail, the region other than the grid structure 310G or 310B in each pixel may be defined as a light reception region. In this case, the light reception area may be defined as the area of the light reception region.

For example, a light reception region of the first pixel may refer to a first light reception region, and a light reception area of the first light reception region may refer to a first light reception area. Similarly, a light reception region of the second pixel may refer to a second light reception region, and a light reception area of the second light reception region may refer to a second light reception area. A light reception region of the third pixel may refer to a third light reception region, and a light reception area of the third light reception region may refer to a third light reception area.

The pixel array 300 may include a central array CA1 in which two first pixels, the second pixel, and the third pixel are arranged in a (2×2) array.

In the central array CA1, two first pixels may be arranged to face each other in a diagonal direction. For example, in the central array CA1 as shown in FIG. 2, one of the first pixels may be arranged at top left coordinate in the central array CA1 and the other of the first pixels may be arranged at bottom right coordinate in the central array CA1. Other implementations are also possible. For example, in another example, one of the first pixels may be arranged at bottom left coordinate in the central array CA1 and the other of the first pixels may be arranged at top right coordinate in the central array CA1.

In some implementations, the central array CA1 may be repeatedly arranged in the pixel array 300 in a first direction (e.g., a row direction) or in a second direction (e.g., a column direction) perpendicular to the first direction.

For example, although each of the first to third pixels is formed in a square shape and each of the grid structures 310G and 310G is formed in a frame shape that surrounds the square pixel, the first to third pixels and the grid structures 310G and 310G may be formed in different shapes (e.g., a rectangular shape, a diamond shape, etc.) as needed. For example, the grid structures 310G and 310G may have a constant width.

For convenience of description, the image sensing device 100 will hereinafter be described with reference to the central array CA1.

Since one central array CA1 includes two first pixels for each second or third pixel, the pixel area of the first pixels in the entire pixel array 300 may be twice a total sum of pixel areas of the second pixels or a total sum of pixel areas of the third pixels.

As described above, the term “light reception area” may refer to the area obtained by subtracting the area of the grid structures 310G and 310B from the pixel area. Here, the sum of the first light reception areas in the pixel array 300 may be more than twice the sum of the second light reception areas or the sum of the third light reception areas.

In some implementation as shown in FIG. 2, the grid structure 310B may be disposed in the third pixel and the grid structure 310G may be disposed in the second pixel. The grid structure 310G may be disposed in the second pixel, and may physically isolate the second optical filter (G) from the first optical filters (R) adjacent to the second optical filter (G). In addition, the grid structure 310B may be disposed in the third pixel, and may physically isolate the third optical filters (B) from the first optical filters (R) adjacent to the third optical filters (B).

The grid structures 310G and 310B may be disposed around the first to third optical filters R, G, and B, and may prevent incident light having penetrated each of the first to third optical filters R, G, and B from entering into adjacent pixels. Thus, the presence of the grid structures 310G and 310B can be used to avoid or reduce undesired optical crosstalk that would otherwise generate noise.

Incident light may be diffracted by the grid structures 310B and 310G, and diffraction of the incident light may be adjusted according to arrangement shapes of the grid structures 310B and 310G. Such diffraction caused by the grid structures 310B and 310G will be described later with reference to FIG. 3.

In the central array CA1, the grid structures 310G and 310B are not disposed in the first pixel, the grid structure 310G is disposed in the second pixel, and the grid structure 310B is disposed in the third pixel, such that the first light reception area may be identical in size to the pixel area. In this case, the first light reception area may be larger in size than the second or third light reception area.

The shapes of the second and third light reception areas may be changed according to arrangement shapes of the grid structures 310G and 310B. For example, when the grid structures 310G and 310B are arranged to have the same width, the second light reception region may be identical in shape to the third light reception region. In this case, the second light reception area may be identical to the third light reception area.

Since the first light reception area is larger in size than the second or third light reception area, the amount of incident light having penetrated the first optical filter (R) may be greater than the amount of incident light having penetrated the second optical filter (G) or the third optical filter (B).

As the pixels of the image sensing device 100 become smaller in size, sensitivity of incident light may be changed according to wavelengths of light to be sensed. Since the incident lights penetrate the semiconductor substrate at different depths, the sensitivity of each incident light may be changed according to wavelengths of light to be sensed.

As each pixel is miniaturized in size and the substrate is reduced in thickness (e.g., a thin film substrate) by a thinning process, sensitivity degradation in red light may be more problematic than that in other colors. This is because a proper penetration depth of the red light penetrating the semiconductor substrate is deeper than those of lights having other wavelengths.

In order to compensate for sensitivity degradation in red light, the number of first pixels in the pixel array may be adjusted to be greater than the number of second or third pixels in the pixel array, and the grid structures 310G and 310B may not be disposed in the first pixel.

In some implementations, each of the grid structures 310G and 310B may include at least one of a metal material and a low refractivity material. In this case, the low refractivity material may refer to a material (e.g., silicon dioxide, etc.) having a lower refractive index than the semiconductor substrate or the optical filter.

If each of the grid structures 310G and 310B is formed of or include a metal material, incident light is reflected and/or absorbed by the metal material in the grid structures 310G and 310B to prevent crosstalk between adjacent pixels. If each of the grid structures 310G and 310B is formed of or includes a low refractivity material with a refractive index lower than that of the optical filter G or B, a portion of the incident light to the optical filter G or B may be totally reflected by a difference in refractive indices between the grid structures 310G and 310B and the first to third optical filters R, G, and B, resulting in prevention of crosstalk between adjacent pixels.

Figure 3:
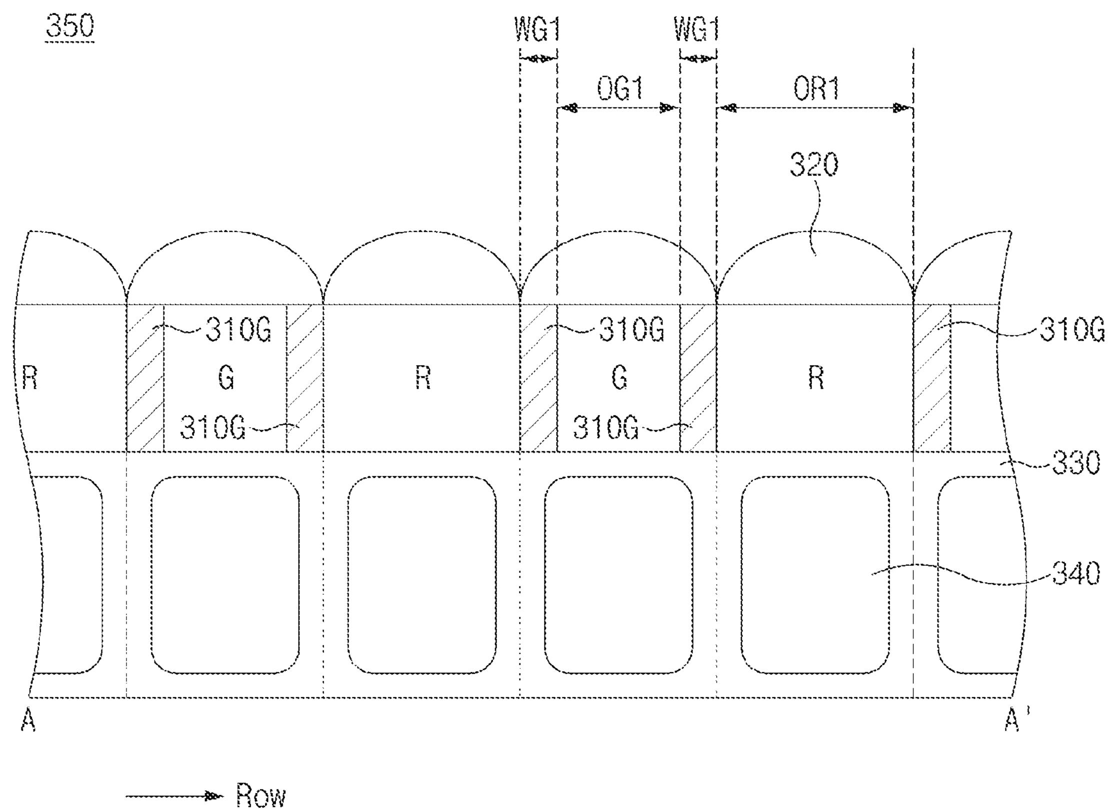
FIG. 3 is a cross-sectional view illustrating an example of an image sensing device based on a first embodiment of the disclosed technology.

FIG. 3 is a cross-sectional view illustrating an example of the image sensing device 100 based on a first embodiment of the disclosed technology.

FIG. 3 is a cross-sectional view 350 illustrating the pixel array 300 taken along a first cutting line A-A' shown in FIG. 2.

Referring to FIG. 3, the image sensing device 100 may include microlenses 320, first and second optical filters R and G, grid structures 310G, a semiconductor substrate 330, and photoelectric conversion elements 340.

The semiconductor substrate 330 may include a plurality of photoelectric conversion elements 340. Each first optical filter (R) or each second optical filter (G) may overlap with one optical filter element 340. In addition, one microlens 320 may be disposed over each of the first and second optical filters R and G.

The microlens 320 may allow the incident light to converge upon the photoelectric conversion element 340. The optical path of such incident light may be changed according to a refractive index, curvature, arrangement shape, etc. of the microlens 320. The incident light focused by the microlens 320 may be incident upon the first and second optical filters R and G. The first and second optical filters R and G may selectively pass or transmit the incident light, and the incident light having penetrated the first and second optical filters R and G may reach the photoelectric conversion elements 340 to generate photocharges.

The first and second optical filters R and G may be disposed between the microlens 320 and the substrate 330. The first and second optical filters R and G may be arranged in a specific pattern based on a predefined design such that the first and second optical filters R and G can correspond to the plurality of photoelectric conversion elements 340.

The first and second optical filters R and G may be formed to have a thickness that is determined based on the amount of added pigments and required transmission characteristics. The first and second optical filters R and G may filter incident light received through the microlens 320, such that the filtered light of certain colors can penetrate the first and second optical filters R and G, respectively.

The semiconductor substrate 330 may be in a monocrystalline state, and may include a silicon-containing material. In some implementations, the substrate 330 may include P-type impurities.

The photoelectric conversion elements 340 may be formed or located in the substrate 130. Each photoelectric conversion element 340 may include an inorganic photodiode. The photoelectric conversion element 340 may absorb incident light, and may accumulate charges corresponding to the amount of incident light (i.e., intensity of incident light) in an inner region thereof. The photoelectric conversion element 340 may be implemented as a photodiode, a phototransistor, a photogate, a pinned photodiode (PPD) or a combination thereof.

The photoelectric conversion element 340 may include impurity regions vertically stacked in the semiconductor substrate 330.

For example, if the photoelectric conversion element 340 is implemented as a photodiode, the photoelectric conversion element 340 may include a stacked structure in which an N-type impurity region and a P-type impurity region are vertically stacked. In this case, the N-type impurity region and the P-type impurity region of the photoelectric conversion element 340 may be formed by sequential ion implantation processes.

The grid structure 310G may be disposed in the second pixel including the second optical filter (G). The above-mentioned implementation has disclosed the cross-sectional view of the pixel array taken along the first cutting line A-A' extending in a row direction in which the first pixel and the second pixels are arranged. If taking the cross-sectional view of another region along the cutting line extending in the row direction in which the first pixels and the third pixels are disposed, the cross-sectional view may illustrate the grid structure disposed in the third pixel.

As previously described in FIG. 2, each of the first to third pixels may be formed in a square shape, and the grid structure 310G may be formed in a frame shape surrounding the square pixels. Thus, the other cross-sectional view of the pixel array taken along the cutting line that extends in a column direction may also be substantially identical in shape to the cross-sectional view of the pixel array taken along the cutting line extending in the row direction.

Since the grid structure 310G is disposed in the second pixel, the width (OG1) of the second light reception region may be smaller than the width (OR1) of the first light reception region.

Since the width (OR1) of the first light reception region is larger than the width (OG1) of the second light reception region, the amount of incident light having penetrated the first optical filter (R) may be greater than the amount of incident light having penetrated the second optical filter (G).

The width (WG1) of the grid structure 310G may be constant for each pixel. For example, the second pixels in the pixel array may have the grid structures 310G whose width is same in each second pixel.

In some implementations, the width (WG1) of the grid structure 310G may be determined experimentally. The width (WG1) of the grid structure 310G may be affected by various factors, for example, a distance from the center point of the pixel array 300 to the corresponding grid structure 310G, sensitivity of incident light to be measured, diffraction of incident light to be measured, and others.

As the pixel becomes smaller in size, diffraction of the incident light affected by the grid structure 310G may deteriorate characteristics of the image sensing device 100.

As the width (OR1) of the first light reception region or the width (OG1) of the second light reception region becomes smaller, light can become diffracted by the first and second light reception regions. The small width of the light reception region may indicate that the distance between the grid structures 310G is short. As a result, a separation distance between slits is reduced, such that diffraction can more easily occur.

In addition, as the wavelength of incident light becomes longer, diffraction may more easily occur. When diffraction occurs, the incident light may be diffused to the surrounding adjacent pixels, such that the incident light diffused to the adjacent pixels may cause crosstalk.

As the width (OR1) of the first light reception region is larger than the width (OG1) of the second light reception region, diffraction of incident light (red light) which has penetrated the first optical filter (R) may be less than diffraction of incident light (green light) which has penetrated the second optical filter (G). Because of the width (OR1) and wavelength of incident light. Therefore, the sensing sensitivity of red light (long-wavelength signal) can be improved in small pixels. As crosstalk of red light caused by diffraction decreases.

Figure 4:
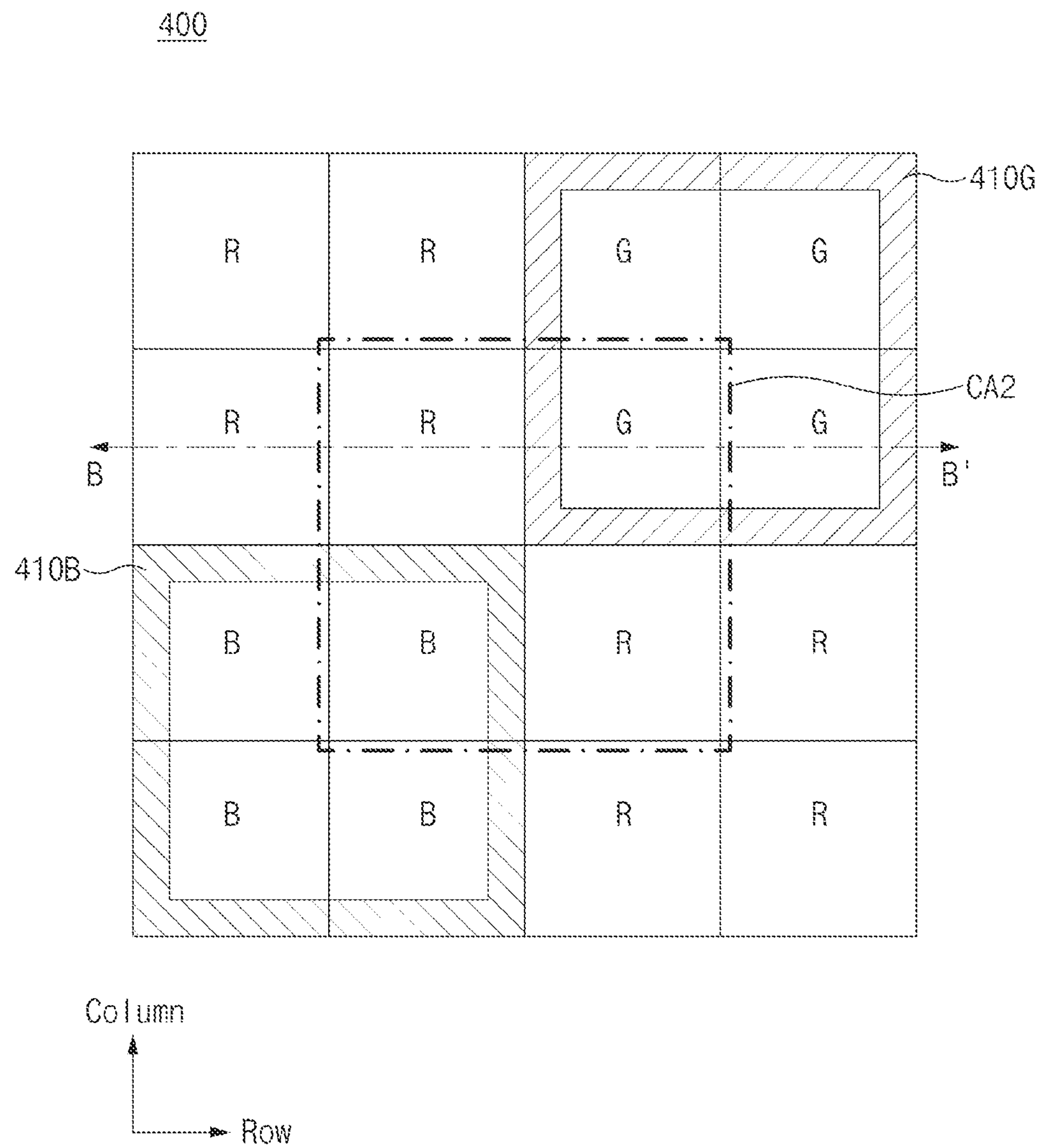
FIG. 4 is a schematic diagram illustrating an example of a pixel array based on a second embodiment of the disclosed technology.

FIG. 4 is a schematic diagram illustrating an example of a pixel array 400 based on a second embodiment of the disclosed technology.

In this example implementation, the pixel array includes the central array 400 including the first to third pixels as discussed in the first embodiment of the disclosed technology as shown in FIG. 2. Unlike the first embodiment, however, in the pixel array 400 as shown in FIG. 4, the pixels disposed outside of the central array CA2 are arranged such that each of the first to third pixels contained in the central array CA2 of the pixel array 400 may extend to a corresponding (2×2) quad array. For example, first pixels are all arranged in the (2×2) quad array including the first pixel at the top left coordinate in the central array CA2, second pixels are all arranged in the (2×2) quad array including the second pixel at the top right coordinate in the central array CA2, third pixels are all arranged in the (2×2) quad array including the third pixel at the bottom left coordinate in the central array CA2, and the first pixels are all arranged in the (2×2) quad array including the first pixel at the bottom right coordinate in the central array CA2. In this manner, a (4×4) array including the first to third quad arrays is illustrated in FIG. 4.

The term "quad array" may refer to a (2×2) array in which pixels including the optical filters corresponding to the same color are extended and arranged. For example, the first quad array may refer to a (2×2) array in which the first pixels including the first optical filters (R) are extended and arranged. Similarly, the second quad array may refer to a (2×2) array in which the second pixels are extended and arranged, and the third quad array may refer to a (2×2) array in which the third pixels are extended and arranged.

In some implementations, the pixel array 400 may include a (4×4) array in which two first quad arrays, a second quad array, and a third quad array are arranged. In the pixel array 400, the (4×4) array may be repeatedly arranged in the row or column direction.

For example, although the above-mentioned implementation has assumed that each of the first to third pixels is formed in a square shape and each of the first to third quad arrays is also formed in a square shape for convenience of description, the scope of the disclosed technology is not limited thereto. Thus, each of the first to third quad arrays can also be formed in other shapes (e.g., a rectangular shape, a diamond shape, etc.) as needed.

In the second embodiment, the grid structure 410G may be disposed in the second pixel including the second optical filter (G), and the grid structure 410B may be disposed in the third pixel including the third optical filter (B). Functions and materials of the first to third optical filters R, G, and B and the grid structures 410G and 410B shown in FIG. 4 may be substantially identical to those of FIGS. 2 and 3, and as such redundant description thereof will herein be omitted for brevity.

In the second embodiment, the grid structure 410G may be arranged along an outer edge of the second quad array. In addition, the grid structure 410B may be arranged along an outer edge of the third quad array. In more detail, the grid structure 410G may be disposed in some inner regions in which the second quad array is adjacent to the first quad array from among inner regions of the second quad array. In addition, the grid structure 410B may be disposed in some inner regions in which the third quad array is adjacent to the first quad array from among inner regions of the third quad array.

Since the grid structures 410G and 410B are arranged in the pixel array 400 as described above, crosstalk between adjacent quad arrays can be prevented.

In the pixel array 400, the first to third pixels may extend to the first to third quad arrays, respectively, such that the first to third quad arrays may be disposed in the pixel array 400. In addition, the grid structure 410G may be disposed in a region in which the second quad array is adjacent to the first quad array and the grid structure 410B may be disposed in a region in which the third quad array is adjacent to the first quad array, such that the second light reception region and the third light reception region can increase in size.

Figure 5:
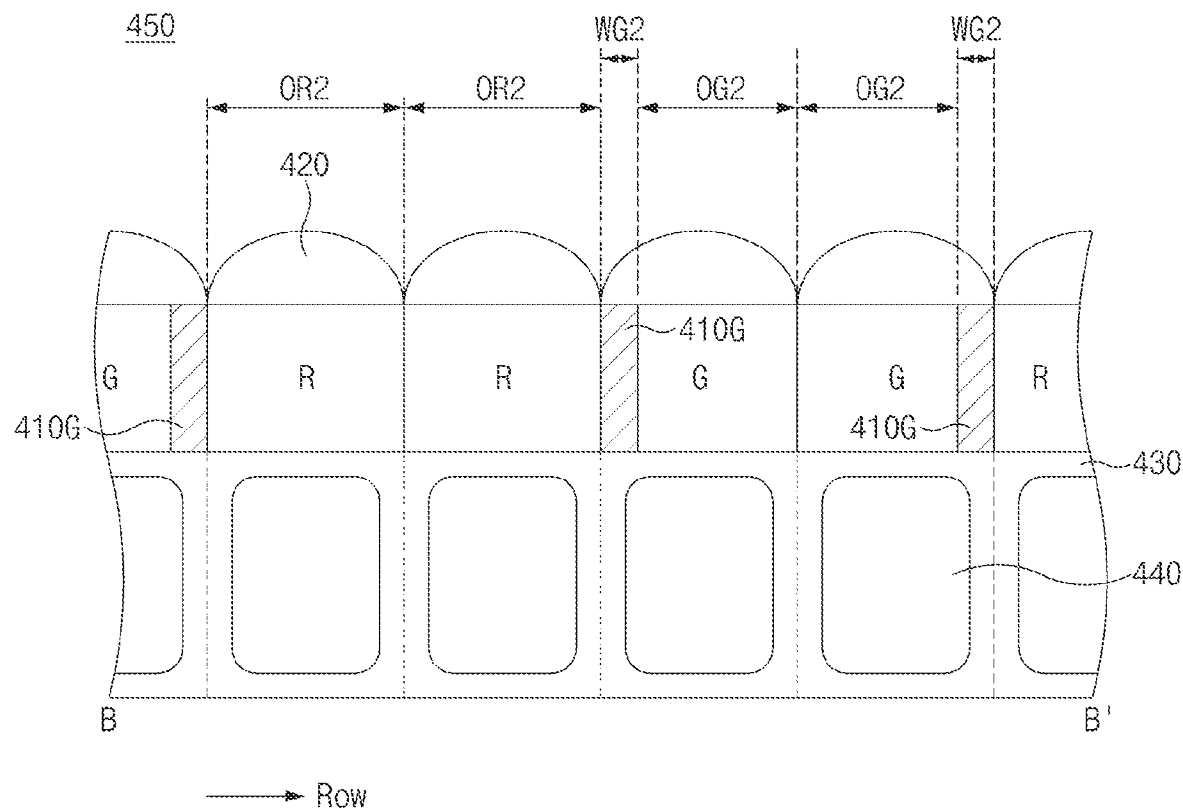
FIG. 5 is a cross-sectional view illustrating an example of an image sensing device based on a second embodiment of the disclosed technology.

FIG. 5 is a cross-sectional view illustrating an example of an image sensing device based on a second embodiment of the disclosed technology.

FIG. 5 is a cross-sectional view 450 illustrating the pixel array 400 taken along a second cutting line B-B' shown in FIG. 4.

Referring to the cross-sectional view 450 of the pixel array 400 shown in FIG. 5, microlenses 420, a substrate 430, and photoelectric conversion elements 440 shown in FIG. 5 may be substantially identical to those of the cross-sectional view 350 of the pixel array shown in FIG. 3, and as such redundant description thereof will herein be omitted for brevity.

In the pixel array 400 based on the second embodiment of the disclosed technology, the first to third pixels contained in the central array CA2 may extend to the first to third quad arrays, respectively, and the extended first to third quad arrays may be disposed in the pixel array 400. As a result, two adjacent first pixels, each of which includes the first optical filter (R), may be arranged alternately with two adjacent second pixels, each of which includes the second optical filter (G).

Although the above-mentioned implementation has disclosed the cross-sectional view of the pixel array taken along the second cutting line B-B' extending in the row direction in which the first pixels each including the first optical filter (R) and the second pixels each including the second optical filter (G) are arranged for convenience of description, the scope of the disclosed technology is not limited thereto. For example, the cross-sectional view of another region (e.g., a region taken along the cutting line extending in a row direction in which the first pixels and the third pixels are disposed) can also be configured in a manner that two first unit pixels each including the first optical filter (R) and two second unit pixels each including the third optical filter (B) are alternately arranged.

As previously described in FIG. 4, each of the first to third quad arrays may be formed in a square shape, and each of the grid structures 410G may be formed in a frame shape that surrounds the square shape while having a constant width for convenience of description. Thus, the other cross-sectional view of the pixel array taken along the cutting line that extends in a column direction may also be substantially identical in shape to the cross-sectional view of the pixel array taken along the cutting line extending in the row direction.

Since the grid structure 410G is disposed in the second pixel, the width (OG2) of the second light reception region may be smaller than the width (OR2) of the first light reception region.

In the second embodiment, the width (OG2) of the second light reception region may increase as compared to that of the first embodiment.

Assuming that the widths (e.g., WG1 of FIG. 3 and WG2 of FIG. 4) of the grid structures are identical to each other in the first and second embodiments, the amount of reduction of the width (e.g., OG1 of FIG. 3) of the second light reception region affected by the width (e.g., WG1 of FIG. 3) of the grid structure with respect to a total width of each pixel region in the first embodiment may be twice the amount of reduction of the width of the second light reception region affected by the grid structure with respect to a total width of each pixel region in the second embodiment. This is because the grid structure 410G of the second embodiment is arranged along the outer edge of the second quad array, such that size reduction of the second light reception region affected by the grid structure 410G can be mitigated.

Since the grid structure 410G is arranged along the outer edge of the second quad array, influence of diffraction of incident light affected by the grid structure 410G can be reduced.

In the first quad array, the distance between the grid structures 410G may be twice the width (OR2) of the first light reception region, such that a separation distance between slits may increase. As a result, diffraction of incident light affected by the grid structure 410G can be reduced. Similarly, in the second quad array, the distance between the grid structures 410G may be twice the width (OG2) of the second light reception region, such that a separation distance between slits can increase.

Figure 6:
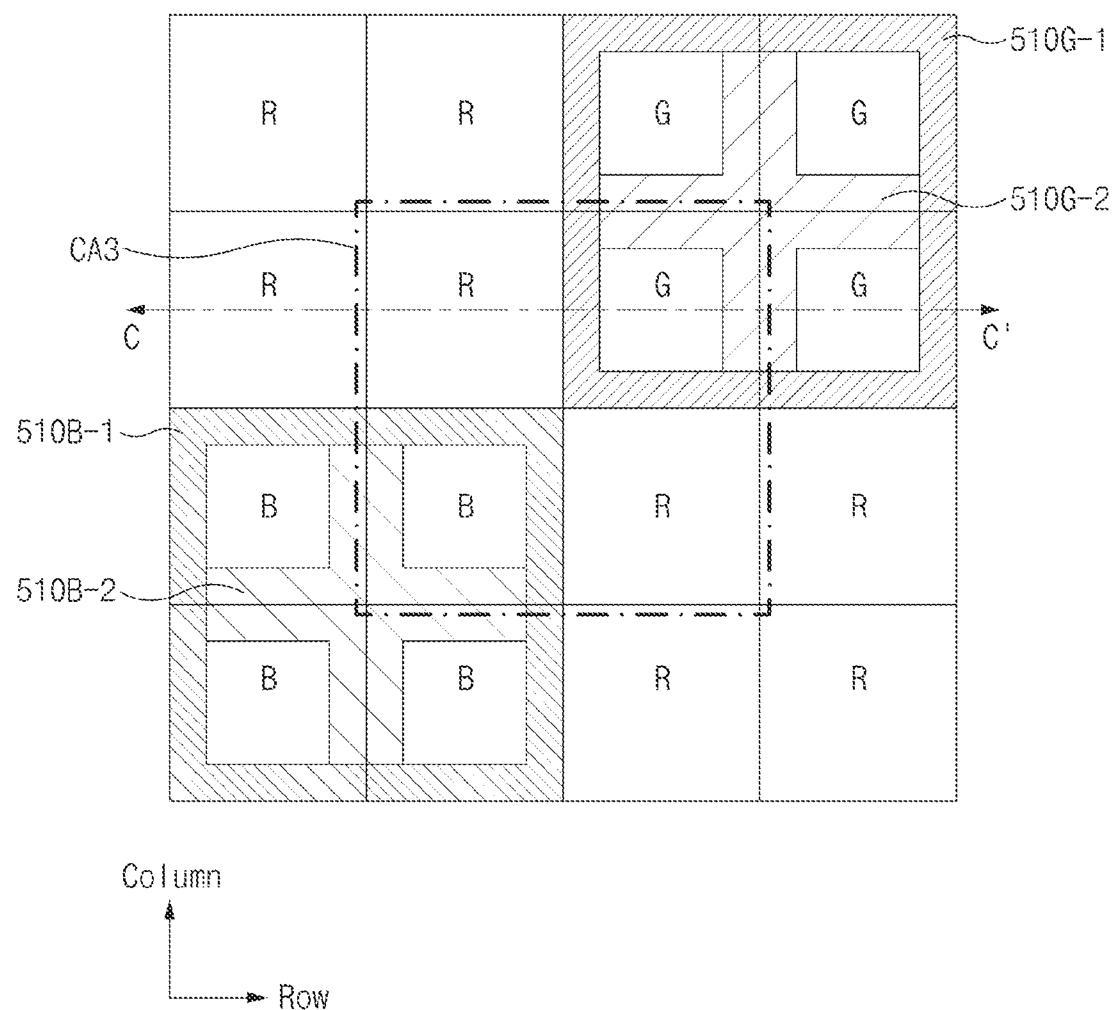
FIG. 6 is a schematic diagram illustrating an example of a pixel array based on a third embodiment of the disclosed technology.

FIG. 6 is a schematic diagram illustrating an example of a pixel array 500 based on a third embodiment of the disclosed technology.

In the third embodiment as shown in FIG. 6, the first to third pixels contained in the central array CA3 of the pixel array 500 may extend to the first to third quad arrays as discussed in the second embodiment as shown in FIG. 4. Thus, the pixel array 500 in the third embodiment also includes a (4×4) array including the first to third quad arrays.

The third embodiment differs from the second embodiment in that each of the second quad array and the third quad array includes internal grid structures. Referring to FIG. 6, the first internal grid structure 510G-2 may be formed in the second quad array obtained by extension of the second pixels, and the first internal grid structure 510B-2 may be formed in the third quad array obtained by extension of the third pixels.

In order to distinguish the above-mentioned first internal grid structures 510G-2 and 510B-2 shown in FIG. 6 from the grid structures 410G and 410B shown in FIG. 4, the grid structures 410G and 410B shown in FIG. 4 will hereinafter be referred to as first outer grid structures 510G-1 and 510B-1, respectively.

Since the first internal grid structures 510G-2 and 510B-2 are formed as shown in FIG. 6, the second and third light reception regions can be adjusted in size. Accordingly, the amount of light reception of desired incident light to be measured can be adjusted.

In addition, since the first internal grid structures 510G-2 and 510B-2 are formed as shown in FIG. 6, the sensitivity of incident light which has penetrated the second optical filter (G) and the third optical filter (B) can be adjusted, such that morphological stability of the grid structures 510G-1, 510B-1, 510G-2, and 510B-2 can be improved.

The first internal grid structure 510G-2 may be disposed along a boundary between the second pixels contained in the second quad array. The first internal grid structure 510B-2 may be disposed along a boundary between the third pixels contained in the third quad array.

The first internal grid structure 510G-2 may be arranged as a cross shape in a region in which the second pixels of the second quad array are adjacent to each other. Similarly, the first internal grid structure 510B-2 may be arranged as a cross shape in a region in which the third pixels of the third quad array are adjacent to each other.

Figure 7:
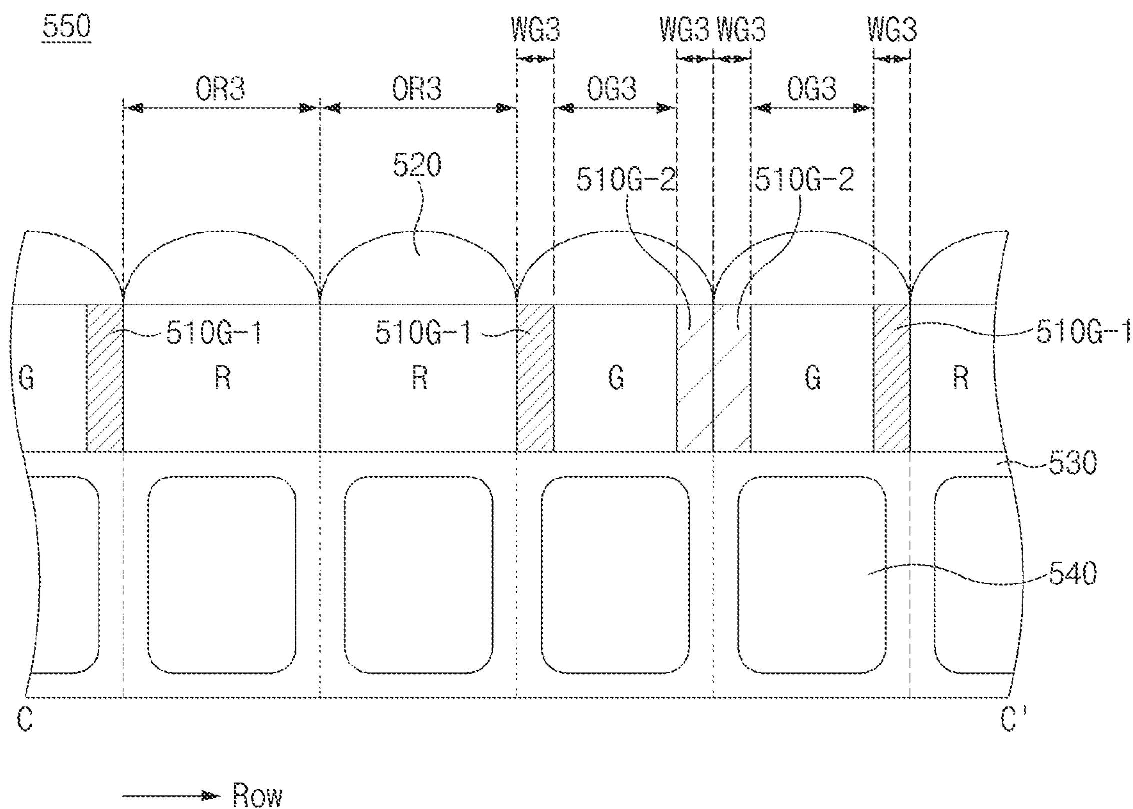
FIG. 7 is a cross-sectional view illustrating an example of an image sensing device based on a third embodiment of the disclosed technology.

FIG. 7 is a cross-sectional view illustrating an example of an image sensing device based on a third embodiment of the disclosed technology.

FIG. 7 is a cross-sectional view 550 illustrating the pixel array 500 taken along a third cutting line C-C' shown in FIG. 6.

A detailed description of the same constituent elements as those discussed with regard to FIG. 5, which include microlenses 520, a semiconductor substrate 530, and photoelectric conversion elements 540, will herein be omitted for brevity. The cross-sectional view 550 of the pixel array 500 shown in FIG. 7 may be different from that shown in FIG. 6 in terms of the arrangement of the first internal/outer grid structure 510G-1 and 510G-2, the width (WG3) of the grid structure, and the width OR3 or OG3 of the first or second light reception region, and thus the descriptions will be focused on those different structures. The remaining parts of the cross-sectional view 550 of the pixel array 500 may be substantially identical to those of the cross-sectional view 450 shown in FIG. 5.

For the second pixel including the second optical filter (G), the first outer grid structure 510G-1 may be disposed in a region in which the second pixel is adjacent to the first pixel. This is because the first outer grid structure 510G-1 is disposed along the outer edge of the second quad array. Since the first outer grid structure 510G-1 is disposed as described above, the first outer grid structure 510G-1 can prevent crosstalk between the first quad array and the second quad array that are adjacent to each other.

Since the first internal grid structure 510G-2 is additionally formed in the second quad array, the width (OG3) of the second light reception region of the third embodiment may be smaller than the width (see OG2 of FIG. 5) of the second light reception region of the second embodiment.

Since the width (OG3) of the second light reception region can be adjusted, the sensitivity of incident light having penetrated the second optical filter (G) can also be adjusted and morphological stability of the grid structures 510G-1 and 510G-2 can be improved.

Figure 8:
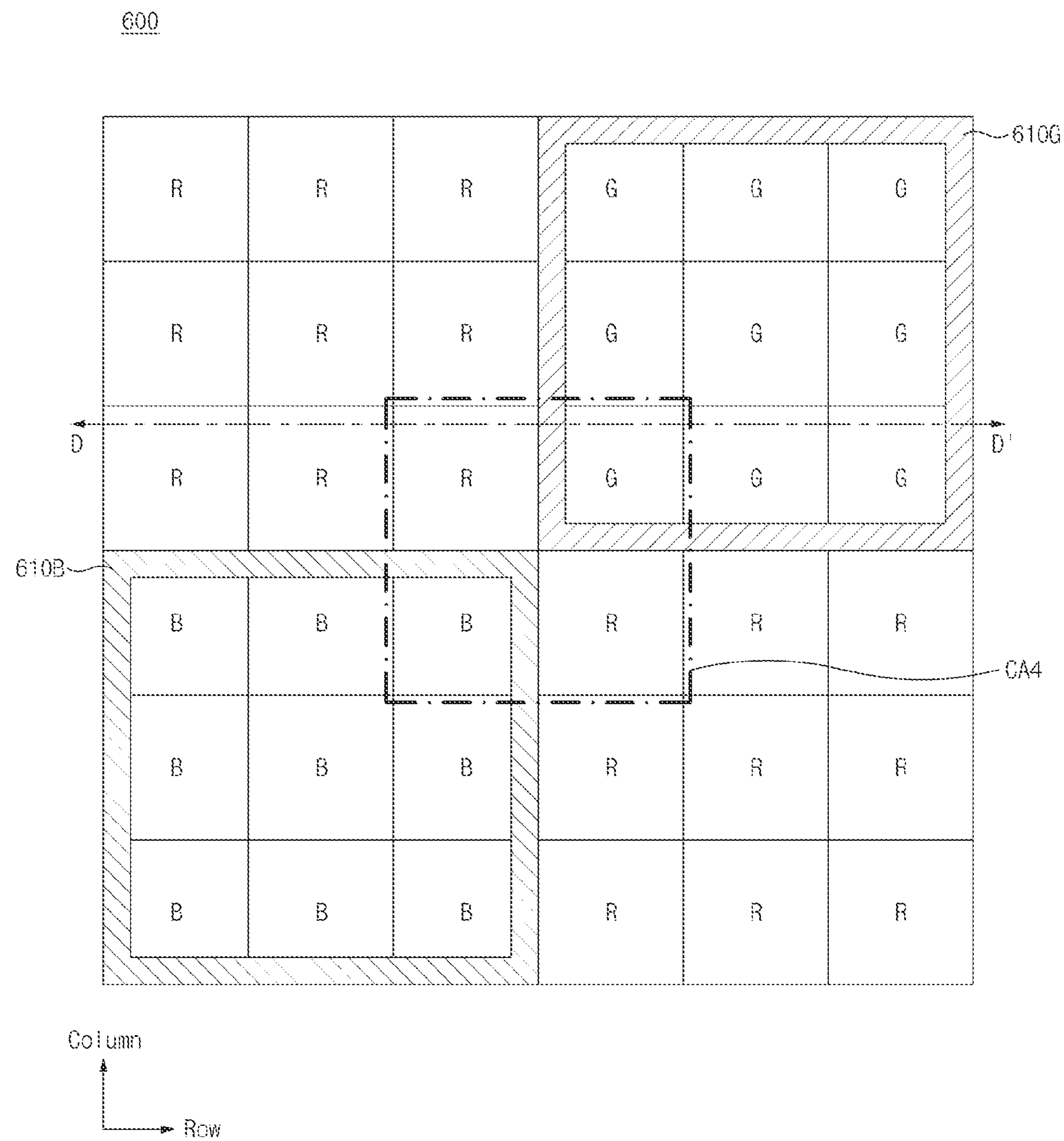
FIG. 8 is a schematic diagram illustrating an example of a pixel array based on a fourth embodiment of the disclosed technology.

FIG. 8 is a schematic diagram illustrating an example of a pixel array 600 based on a fourth embodiment of the disclosed technology.

As can be seen from FIG. 8, first to third pixels contained in the central array CA4 of the pixel array 600 may extend to corresponding (3×3) nona arrays. For example, first pixels are all arranged in the (3×3) nona array including the first pixel at the top left coordinate in the central array CA4, second pixels are all arranged in the (3×3) nona array including the second pixel at the top right coordinate in the central array CA4, third pixels are all arranged in the (3×3) nona array including the third pixel at the bottom left coordinate in the central array CA4, and the first pixels are all arranged in the (3×3) nona array including the first pixel at the bottom right coordinate in the central array CA4. In this manner, a (6×6) array including the first to third nona arrays is illustrated in FIG. 8.

The nona array may refer to a (3×3) array in which pixels including the optical filters corresponding to the same color are extended and arranged. For example, a first nona array may refer to a (3×3) array in which first pixels each including the first optical filter (R) are extended and arranged. Similarly, a second nona array may refer to a (3×3) array in which second pixels are extended and arranged, and a third nona array may refer to a (3×3) array in which third pixels are extended and arranged.

In some implementations, the pixel array 600 may include a (6×6) array in which two first nona arrays, a second nona array, and a third nona array are arranged. In the pixel array 600, the (6×6) array may be repeatedly arranged in the row or column directions.

For example, although the above-mentioned implementation has assumed that each of the first to third pixels is formed in a square shape and each of the first to third nona arrays is also formed in a square shape for convenience of description, the scope of the disclosed technology is not limited thereto, and the first to third nona arrays may be formed in different shapes (e.g., a rectangular shape, a diamond shape, etc.) as needed.

As can be seen from FIG. 8 illustrating the pixel array of the fourth embodiment, the grid structure 610G may be disposed in the second pixel including the second optical filter (G), and the grid structure 610B may be disposed in the third pixel including the third optical filter (B). Functions and materials of the first to third optical filters R, G, and B and the grid structures 610G and 610B shown in FIG. 8 may be substantially identical to those of FIGS. 2 and 3, and as such redundant description thereof will herein be omitted for brevity.

In the fourth embodiment, the grid structure 610G may be disposed along the outer edge of the second nona array, and the grid structure 610B may be disposed along the outer edge of the third nona array. Specifically, the grid structure 610G may be disposed in some regions in which the second nona array is adjacent to the first nona array from among inner regions of the second nona array, and the grid structure 610B may be disposed in some regions in which the third nona array is adjacent to the first nona array from among inner regions of the third nona array.

Since the grid structures 610G and 610B are disposed as described above, crosstalk between adjacent nona arrays can be prevented.

In association with the pixel array 600, the first to third pixels may extend to the first to third nona arrays, respectively, and the extended first to third nona arrays are arranged in the pixel array 600. In addition, the grid structure 610G is disposed in regions in which the second nona arrays is adjacent to the first nona array, and the grid structure 610B is disposed in regions in which the third nona array is adjacent to the first nona array. As a result, each of the second and third light reception regions can increase in size.

A second light reception area of one second pixel disposed at the center of the second nona array obtained by extension of the second pixels may be identical in size to the area of one second pixel. A third light reception area of one third pixel disposed at the center of the third nona array obtained by extension of the third pixels may be identical in size to the area of one third pixel. The second pixel disposed at the center of the second nona array may not include the grid structure 610G, such that a light reception area of the second pixel may be identical in size to the area of one second pixel. Similarly, the third pixel disposed at the center of the third nona array may not include the grid structure 610G, such that a light reception area of the third pixel may be identical in size to the area of one third pixel.

The pixels contained in the second and third nona arrays may be formed to have any one of three kinds of light reception areas.

For example, one second pixel disposed at the center portion (corresponding to a second-row-and-second-column position) from among 9 second pixels contained in the second nona array may not include the grid structure 610G, such that the second light reception area of the second pixel located at the center portion may not be reduced in size.

In the second nona array, the second pixels respectively disposed at a first-row-and-second-column position, a second-row-and-first-column position, a second-row-and-third-column position, and a third-row-and-second-column position may be smaller in size of grid structure 610G overlap area than the other second pixels respectively disposed at a first-row-and-first-column position, a first-row-and-third-column position, a third-row-and-first-column position, and a third-row-and-third-column position, such that light reception regions of the second pixels may be less reduced in size as compared to the other second pixels. Similarly, the above-mentioned description of the second nona array including 9 second pixels can also be equally applied to 9 third pixels contained in the third nona array without departing from the scope of the disclosed technology.

Figure 9:
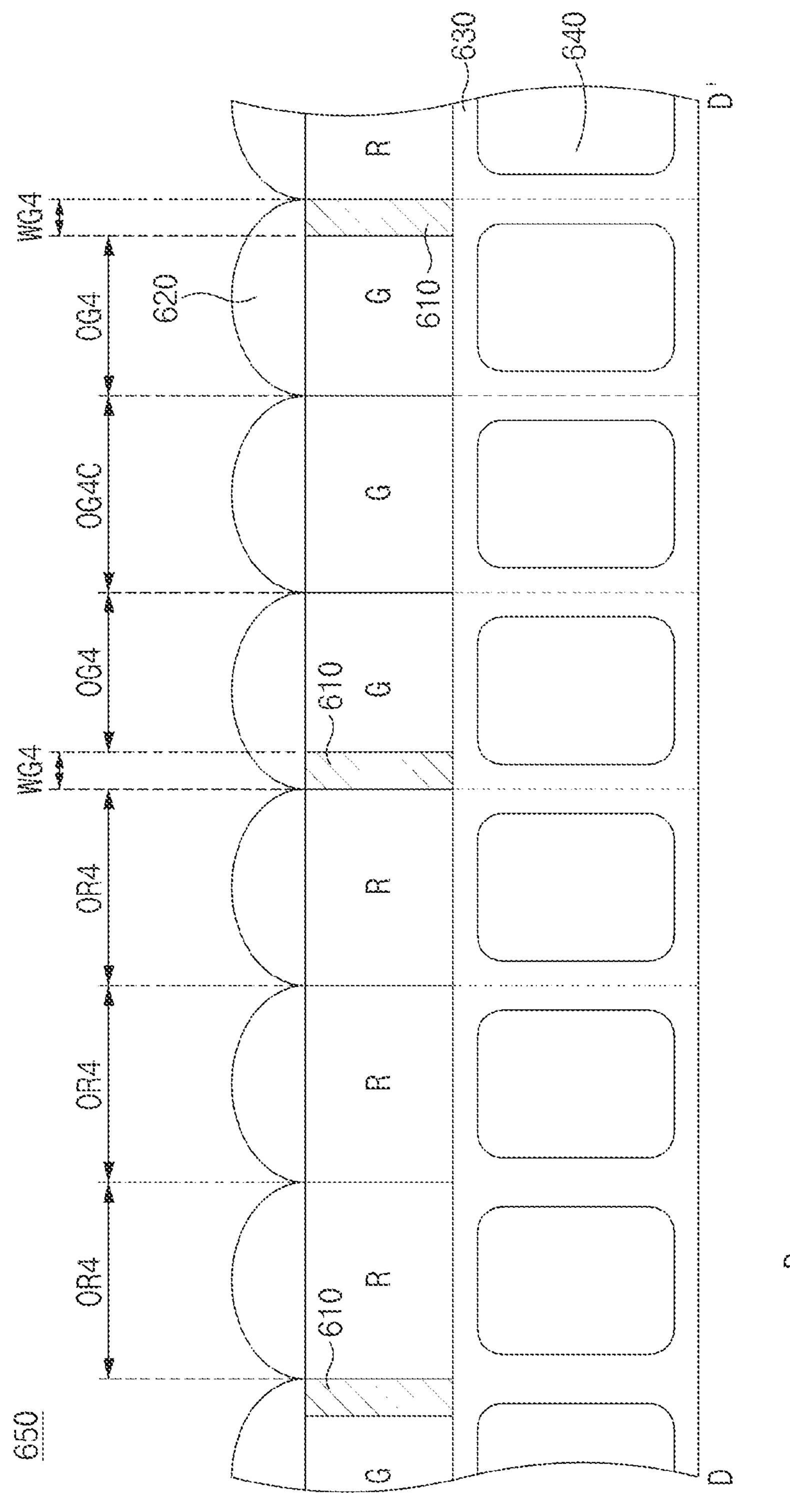
FIG. 9 is a cross-sectional view illustrating an example of an image sensing device based on a fourth embodiment of the disclosed technology.

FIG. 9 is a cross-sectional view illustrating an example of an image sensing device based on a fourth embodiment of the disclosed technology.

FIG. 9 is a cross-sectional view 650 illustrating the pixel array 600 taken along a fourth cutting line D-D' shown in FIG. 8.

Microlenses 620, a substrate 630, and photoelectric conversion elements 640 contained in the cross-sectional view 650 of the pixel array shown in FIG. 9 are substantially identical to those of the above-mentioned cross-sectional view 550 shown in FIG. 7, and as such redundant description thereof will herein be omitted for brevity.

In the pixel array 600 of the fourth embodiment, the first to third pixels contained in the central array CA4 may extend to the first to third nona arrays, respectively, and the extended first to third nona arrays are disposed in the pixel array 600. As a result, three adjacent first pixels each including the first optical filter (R) may be arranged alternately with three adjacent second pixels each including the second optical filter (G).

Although the above-mentioned implementation has disclosed the cross-sectional view 650 of the pixel array taken along the fourth cutting line D-D' extending in a row direction in which the first pixels each including the first optical filter (R) and the second pixels each including the second optical filter (G) are arranged, the scope of the disclosed technology is not limited thereto, and the other cross-sectional view of another region (e.g., a region taken along a cutting line extending in a row direction in which the first pixels and the third pixels are arranged) may illustrate that three first unit pixels each including the first optical filter (R) and three second unit pixels each including the third optical filter (B) are alternately arranged as necessary.

As previously described in FIG. 8, each of the first to third nona arrays may be formed in a square shape and the grid structure 610G may be formed in a frame shape that surrounds the square shape while having a constant width. As a result, the cross-sectional view of the pixel array taken along the cutting line extending in the column direction may also be substantially identical in shape to the cross-sectional view of the pixel array taken along the other cutting line extending in the row direction.

Since the grid structure 610G is disposed in the second pixel as described above, the width (OG4) of the second light reception region may be smaller than the width (OR4) of the first light reception region.

Assuming that the widths (WG4 and WG2 of FIG. 5) of the grid structures are identical to each other in the second and fourth embodiments, the width (OG4) of the second light reception region of the fourth embodiment may be identical to the width (OG2) of the second light reception region of the second embodiment.

As previously described above with reference to FIG. 9, the light reception region of the nona array affected by the grid structure 610G may be changed according to positions of pixels contained in the nona array. As a result, an average size of the light reception regions of the second pixels contained in the second nona array shown in the fourth embodiment may be higher than an average value of the light reception regions of the second pixels contained in the second quad array shown in the second embodiment. In addition, an average size of the light reception regions of the third pixels contained in the third nona array shown in the fourth embodiment may be higher than an average value of the light reception regions of the second pixels contained in the third quad array shown in the second embodiment.

For three adjacent second pixels, the width (OG4C) of the second light reception region of the second pixel (e.g., the central second pixel) disposed at the center portion may be identical to the width (OR4) of the light reception region of the first pixel.

Although the above-mentioned description has disclosed the cross-sectional view of the pixel array taken along the fourth cutting line D-D' extending in the row direction for convenience of description, the scope of the disclosed technology is not limited thereto. For example, the cross-sectional view of the pixel array taken along the cutting line extending in the column direction may be substantially identical in shape to the cross-sectional view of the pixel array taken along the cutting line extending in the row direction.

Since the grid structure 610G is arranged along the outer edge of the second nona array, influence of diffraction of incident light affected by the grid structure 610G may be reduced.

In the first nona array, the distance between the grid structures 610G may be three times the width (OR3) of the first light reception region, such that a separation distance between slits may increase. As a result, diffraction of incident light affected by the grid structure 610G can be reduced. Similarly, in the second nona array, the distance between the grid structures 610G may be a total sum of the width (OG4C) of the second light reception region of the second pixel disposed at the center portion and twice the width (OG4) of the second light reception region, such that a separation distance between slits can increase.

Figure 10:
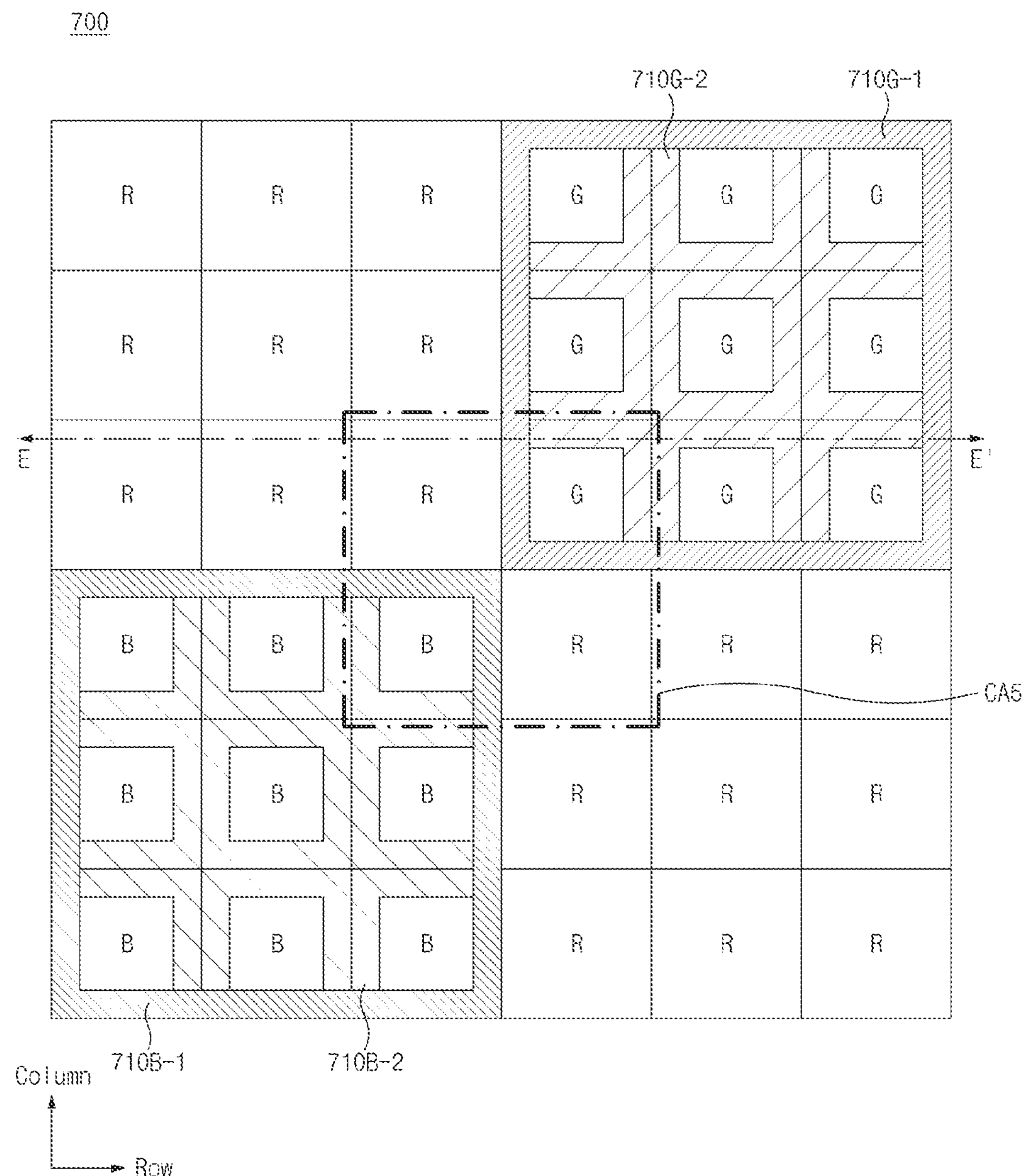
FIG. 10 is a schematic diagram illustrating an example of a pixel array based on a fifth embodiment of the disclosed technology.

FIG. 10 is a schematic diagram illustrating an example of a pixel array 700 based on a fifth embodiment of the disclosed technology.

In the same manner as in the fourth embodiment, the first to third pixels contained in the central array CA5 of the pixel array 700 shown in FIG. 10 may extend to the first to third nona arrays, respectively, and a (6×6) array including the first to third nona arrays is illustrated in FIG. 6.

Referring to FIG. 10, in the second nona array obtained by extension of the second pixels and in the third nona array obtained by extension of the third pixels, second internal grid structures 710G-2 and 710B-2 may be additionally formed in the second and third nona arrays, respectively. In more detail, the second internal grid structure 710G-2 may be additionally formed in the second nona array, and the second internal grid structure 710B-2 may be additionally formed in the third nona array.

In order to distinguish the above-mentioned second internal grid structures 710G-2 and 710B-2 shown in FIG. 10 from the grid structures 610G and 610B shown in FIG. 8, the grid structures 610G and 610B shown in FIG. 8 will hereinafter be referred to as second outer grid structures 710G-1 and 710B-1, respectively.

Since the second internal grid structures 710G-2 and 710B-2 are formed as shown in FIG. 10, the second and third light reception regions can be adjusted in size. Accordingly, the amount of light reception of desired incident light to be measured can be adjusted.

In addition, since the second internal grid structures 710G-2 and 710B-2 are formed as shown in FIG. 10, the sensitivity of incident light having penetrated the second optical filter (G) and the third optical filter (B) can be adjusted, such that morphological stability of the grid structures 710G-1, 710B-1, 710G-2, and 710B-2 can be improved.

The second internal grid structure 710G-2 may be disposed along a boundary between the second pixels contained in the second nona array. In addition, the second internal grid structure 710B-2 may be disposed along a boundary between the third pixels contained in the third nona array.

The second internal grid structure 710G-2 may be denoted by a hash symbol in a region in which the second pixels of the second nona array are adjacent to each other. Similarly, the first internal grid structure 710B-2 may be denoted by a hash symbol in a region in which the third pixels of the third nona array are adjacent to each other.

Figure 11:
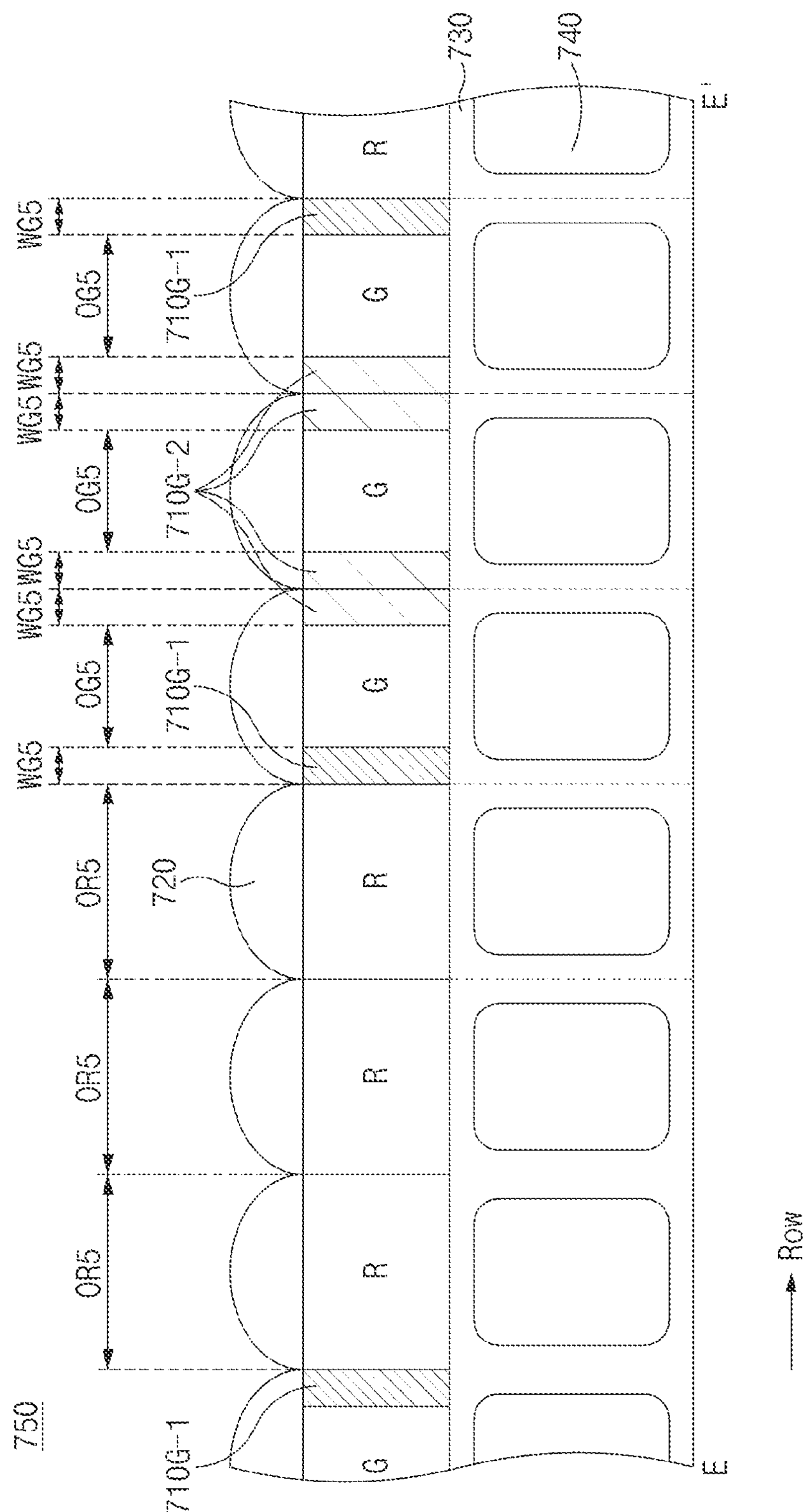
FIG. 11 is a cross-sectional view illustrating an example of an image sensing device based on a fifth embodiment of the disclosed technology.

FIG. 11 is a cross-sectional view illustrating an example of an image sensing device based on a fifth embodiment of the disclosed technology.

FIG. 11 is a cross-sectional view 750 illustrating the pixel array 700 taken along a fifth cutting line E-E' shown in FIG. 10.

The remaining parts of the cross-sectional view 750 of the pixel array 700 shown in FIG. 11 other than arrangement of the second internal/outer grid structures 710G-1 and 710G-2, the width (WG5) of the grid structure, and the width OR5 or OG5 of the light reception region may be substantially identical to those of the cross-sectional view 650 shown in FIG. 9, and a detailed description of the same constituent elements (e.g., microlenses 720, a semiconductor substrate 730, and photoelectric conversion elements 740) as those of FIG. 9 will herein be omitted for brevity.

For the second pixel including the second optical filter (G), the second outer grid structure 710G-1 may be disposed in a region in which the second pixel is adjacent to the first pixel. This is because the second outer grid structure 710G-1 is disposed along the outer edge of the second nona array. Since the second outer grid structure 710G-1 is disposed as described above, crosstalk between the nona arrays including different optical filters R and G adjacent to each other can be prevented.

Since the second internal grid structure 710G-2 is additionally formed in the second nona array, the width (OG5) of the second light reception region of the fifth embodiment may be smaller than the width (see OG4 or OG4C of FIG. 9) of the second light reception region of the fourth embodiment.

Since the width (OG5) of the second light reception region can be adjusted, the sensitivity of incident light having penetrated the second optical filter (G) can also be adjusted and morphological stability of the grid structures 710G-1 and 710G-2 can be improved.

As is apparent from the above description, the image sensing device based on some implementations of the disclosed technology can prevent optical crosstalk between pixels while guaranteeing the area of a red-light reception circuit. Moreover, although the pixel becomes smaller in size due to the guaranteed area of the red-light reception circuit, sensitivity deterioration of a long-wavelength (red light) signal can be prevented.

Although a number of illustrative embodiments have been described, it should be understood that numerous modifications of the disclosed embodiments and other embodiments can be devised based on what is described and/or illustrated in this patent document.

What is claimed is:

1. An image sensing device, comprising:

a pixel array including a (2×2) array that includes two first pixels, a second pixel, and a third pixel, wherein the first to third pixels have a pixel area and include first to third optical filters that are configured to transmit light of different colors, respectively, and wherein the second pixel or the third pixel includes a grid structure located along a boundary of the second pixel or the third pixel, and wherein each of the first pixels includes a red optical filter and has a first light reception area that is greater than a second light reception area of the second pixel or a third light reception area of the third pixel.

2. The image sensing device according to claim 1, wherein:

the two first pixels are arranged to face each other in a diagonal direction.

3. The image sensing device according to claim 2, wherein the pixel array further includes additional first to third pixels surrounding the (2×2) array to form a (4×4) array including the (2×2) array at a center of the (4×4) array, wherein the (4×4) array includes two first (2×2) arrays that include the first pixels and the additional first pixels, a second (2×2) array including the second pixel and the additional second pixels, and a third (2×2) array including the third pixel and the additional third pixels.

4. The image sensing device according to claim 3, wherein:

in the pixel array, the (4×4) array is repeatedly arranged either in a first direction or in a second direction perpendicular to the first direction.

5. The image sensing device according to claim 3, wherein:

the grid structure is disposed along an outer boundary of the second (2×2) array that is located on a same row with one of the first (2×2) arrays; and the grid structure is disposed along an outer boundary of the third (2×2) array that is located on a same row with the other of the first (2×2) arrays.

6. The image sensing device according to claim 5, wherein the grid structure further includes:

a first internal grid structure disposed along a boundary between the second pixel and the additional second pixels and along a boundary between the third pixel and the additional third pixels.

7. The image sensing device according to claim 2, wherein the pixel array further includes additional first to third pixels surrounding the (2×2) array to form (6×6) array including the (2×2) array at a center of the (6×6) array, wherein the (6×6) array includes two first (3×3) arrays that include the first pixel and the additional first pixels, a second (3×3) array including the second pixel and the additional second pixels, and a third (3×3) array including the third pixel and the additional third pixels.

8. The image sensing device according to claim 7, wherein:

in the pixel array, the (6×6) array is repeatedly arranged either in a first direction or in a second direction perpendicular to the first direction.

9. The image sensing device according to claim 7, wherein:

the grid structure is disposed along an outer boundary of the second (3×3) array that is located on a same row with one of the first (3×3) arrays; and the grid structure is disposed along an outer boundary of the third (3×3) array that is located on a same row with the other of the first (3×3) arrays.

10. The image sensing device according to claim 9, wherein the grid structure further includes:

a second internal grid structure disposed along a boundary between the second pixel and the additional second pixels and along a boundary between the third pixel and the additional third pixels.

11. The image sensing device according to claim 7, wherein a second light reception area of one of the additional second pixels that is disposed at a center portion of the second (3×3) array is identical in size to the pixel area; and a third light reception area of one of the additional third pixels that is disposed at a center portion of the third (3×3) array is identical in size to the pixel area.

12. The image sensing device according to claim 1, wherein:

the second pixel includes a green optical filter; and the third pixel includes a blue optical filter.

13. The image sensing device according to claim 1, wherein:

the first light reception area is identical in size to the pixel area.

14. The image sensing device according to claim 1, wherein:

the second light reception area is identical in size to the third light reception area.

15. The image sensing device according to claim 1, wherein:

in the pixel array, the (2×2) array is repeatedly arranged either in a first direction or in a second direction perpendicular to the first direction.

16. The image sensing device according to claim 1, wherein:

the grid structure includes at least one of a metal material and a low refractivity material that has a lower refractive index than the optical filter.

17. An image sensing device comprising:

a pixel array including first to third pixels that respectively include first to third optical filters corresponding to different wavelengths of light, wherein the first pixel has a light reception region that is larger in size than a light reception region of the second pixel adjacent to the first pixel or a light reception region of the third pixel adjacent to the first pixel;

the second pixel or the third pixel includes a grid structure disposed at one side of the second pixel or the third pixel;

the first optical filter is a red optical filter, and wherein a number of the first pixels contained in the pixel array is twice a number of the second pixels contained in the pixel array or a number of the third pixels contained in the pixel array.

18. The image sensing device according to claim 17, wherein the pixel array includes:

two or more first (2×2) arrays including the first pixels, one or more second (2×2) arrays including the second pixels, and one or more third (2×2) arrays including the third pixels, wherein a number of the first (2×2) arrays contained in the pixel array is twice a number of the second (2×2) arrays or a number of the third (2×2) arrays.

19. The image sensing device according to claim 17, wherein the pixel array includes:

two or more first (3×3) arrays including the first pixels, one or more second (3×3) arrays including the second pixels, and one or more third (3×3) arrays including the third pixels, wherein a number of the first (3×3) arrays contained in the pixel array is twice a number of the second (3×3) arrays or the number of the third (3×3) arrays.

20. An image sensing device comprising:

a pixel array including an array of different pixels for sensing incident light to capture imaging information in the incident light, wherein adjacent different pixels include different optical filters to selectively transmit light in at least three different wavelengths of light to be sensed, wherein the adjacent different pixels include a first pixel, a second, pixel, and a third pixel, and wherein:

the first pixel includes a light reception region that is larger in size than a light reception region of the second pixel adjacent to the first pixel or a light reception region of the third pixel adjacent to the first pixel;

the second pixel or the third pixel includes a grid structure disposed at one side of the second pixel or the third pixel; and the first optical filter is a red optical filter, and wherein the pixel array includes:

two or more first (3×3) arrays including the first pixels, one or more second (3×3) arrays including the second pixels, and one or more third (3×3) arrays including the third pixels, wherein a number of the first (3×3) arrays contained in the pixel array is twice a number of the second (3×3) arrays or the number of the third (3×3) arrays.

* * * * *